United States Patent [19]

Allison et al.

[11] Patent Number: 5,169,192
[45] Date of Patent: Dec. 8, 1992

[54] ELECTRONIC ARTICLE PICKUP TOOL

[75] Inventors: Quincy D. Allison, Boulder Creek; William G. Busby, San Jose, both of Calif.

[73] Assignee: H-Square Corporation, Sunnyvale, Calif.

[21] Appl. No.: 722,667

[22] Filed: Jun. 28, 1991

[51] Int. Cl.⁵ .............................................. B66C 1/02
[52] U.S. Cl. ................................... 294/64.1; 251/321
[58] Field of Search .................... 294/64.1, 64.2, 64.3; 251/319, 321, 330; 269/21; 901/40; 29/743, 758

[56] References Cited

U.S. PATENT DOCUMENTS

| 954,927 | 4/1910 | Burdick | 294/64.1 |
|---|---|---|---|
| 1,302,028 | 4/1919 | Fuchs et al. | 294/64.1 |
| 2,310,164 | 2/1943 | Prendergast et al. | 251/321 X |
| 2,635,623 | 4/1953 | Moffett | 251/321 X |
| 2,723,681 | 11/1955 | MacGlashan, Jr. et al. | 251/324 X |
| 3,058,718 | 10/1962 | Johnson | 251/321 X |
| 3,071,402 | 1/1963 | Lasto et al. | 294/64.1 |
| 3,168,353 | 2/1965 | Horowitz | 251/321 X |
| 3,335,727 | 8/1967 | Spoto | 128/276 |
| 4,618,178 | 10/1986 | Hutson et al. | 294/64.1 |
| 4,744,594 | 5/1988 | Poli et al. | 294/64.1 |
| 4,767,142 | 8/1988 | Takahashi et al. | 294/64.1 |

FOREIGN PATENT DOCUMENTS

| 39874 | 4/1978 | Japan | 294/64.1 |
|---|---|---|---|
| 6385 | 3/1909 | United Kingdom | 294/64.1 |

Primary Examiner—Charles A. Marmor
Assistant Examiner—Dean J. Kramer
Attorney, Agent, or Firm—Schneck & McHugh

[57] ABSTRACT

A vacuum-actuated tool for handling of electronic articles, such as integrated circuit chips, wherein the tool includes an elongated body having first, second, and third passageways. The second passageway is connected to a vacuum source, while the first passageway leads to a pickup tip that contacts the article to be handled. Positive pressure sealing provides a leak-proof closure of the second passageway when the article is to be released. The third passageway is in fluid communication with the atmosphere and is linked to the first passageway simultaneously with the positive pressure sealing of the second passageway. In a pickup position, the third passageway to the atmosphere is pressure sealed to prevent leakage through the third passageway to the atmosphere. The pressure seals are provided by elastomeric members.

11 Claims, 4 Drawing Sheets

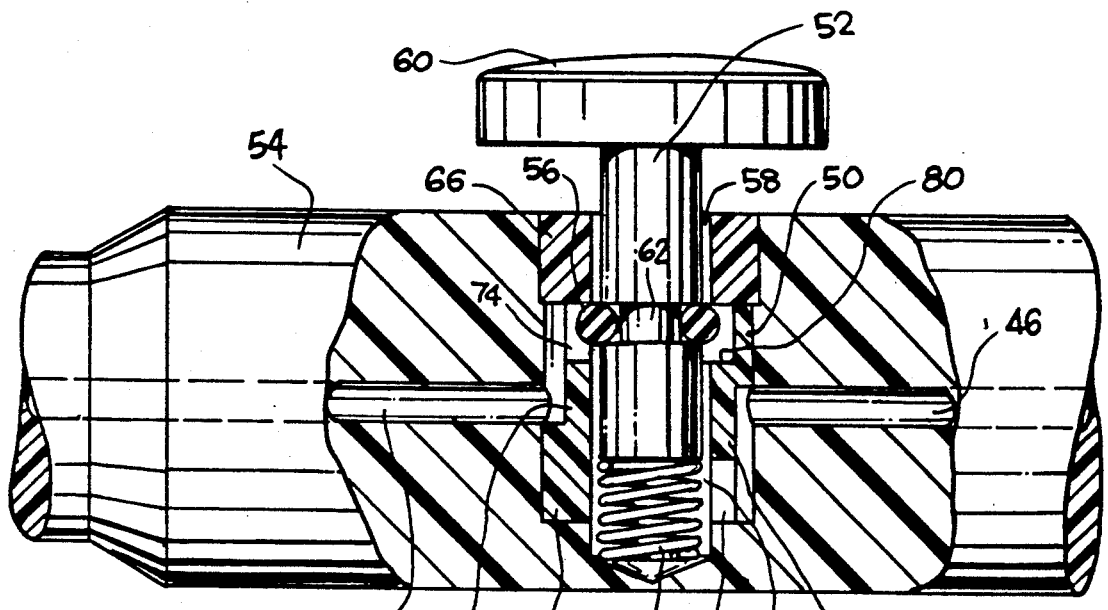
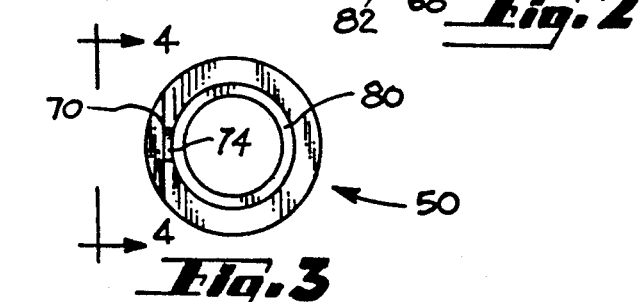
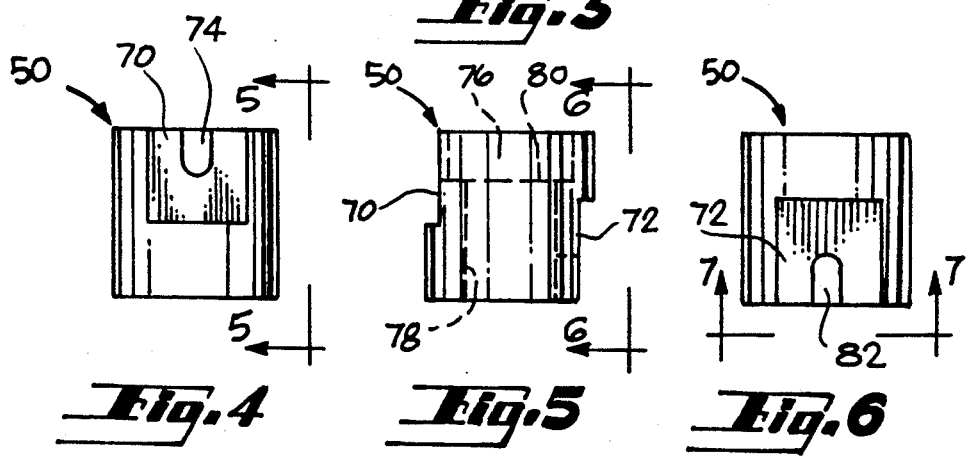
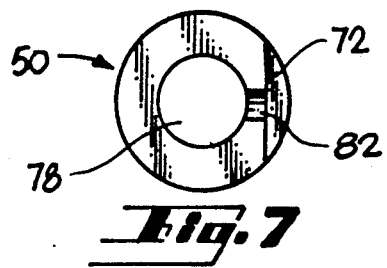

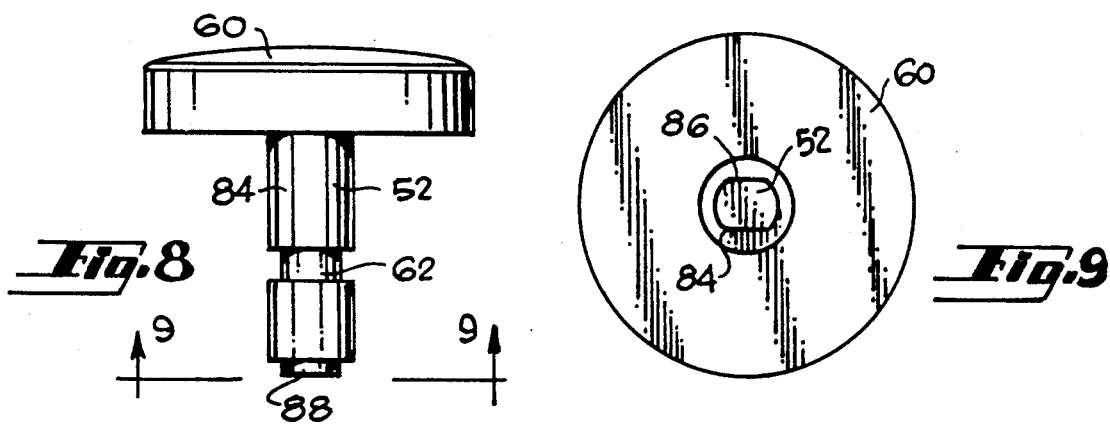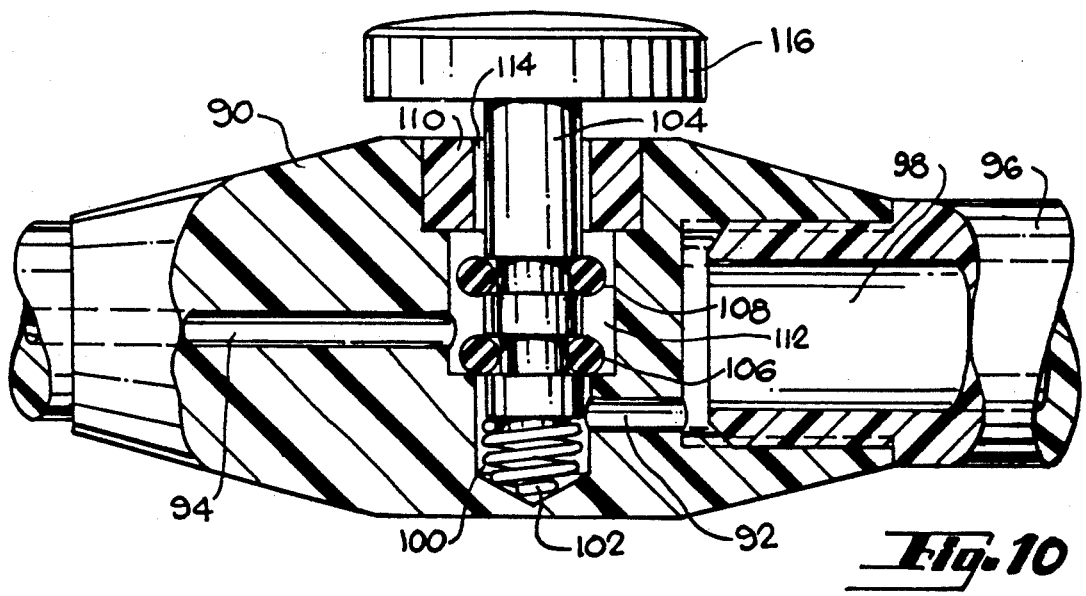

ELECTRONIC ARTICLE PICKUP TOOL

TECHNICAL FIELD

The present invention relates generally to tools for the handling of semiconductor wafers, chips and other electronic articles and more particularly to valving mechanisms for vacuum-operated tools.

BACKGROUND ART

In the fabrication of integrated circuit chips, vacuum-operated devices are used for the handling of individual semiconductor articles. Such devices typically include a vacuum-actuated tool and a replaceable wand tip having a pocket in vacuum communication with the tool. In operation, the surface of the wand tip associated with the vacuum pocket is brought into contact with the wafer, so that the wafer is maintained against the surface until the vacuum pressure is released.

Handling of a semiconductor wafer or chip should be performed swiftly, but carefully. Typically, a valving mechanism is contained within the handling tool. The most common valving mechanism is one in which a user presses a reciprocating button or lever to cause displacement of a valve stem. The valve stem is a cylindrical member having a circular groove cut into the outside surface. The valve stem may be biased into a position in which the circular groove is aligned with an axial bore of the tool, thereby allowing fluid communication between the forward portion and rearward portion of the axial bore. A force which overcomes the bias displaces the circular groove relative to the axial bore, restricting air flow from the forward portion to the rearward portion of the axial bore.

One difficulty with the valving mechanism described above is eliminating any leakage through the axial bore when the circular groove on the valve stem is misaligned with the axial bore. The valve stem is slidably fit within the tool. Using tight tolerances to fit the valve stem within the tool minimizes leakage around the valve stem from the forward portion to the rearward portion of the axial bore. However, a tightly fit valve stem requires significant force to move the circular groove from an aligned position to a misaligned position. Over time, the repeated actuation of a tight-tolerance valving mechanism will cause discomfort to a user. An alternative is to provide a valve stem which is less tightly fit into the tool. However, this loose fit permits significant air flow from the forward portion to the rearward portion of the axial bore. At the forward portion of the axial bore is the tip which is connected to the electronic article to be relocated. Ideally, the actuation of the valving mechanism eliminates vacuum pressure at the tip and the electronic article is released. However, leakage about the valve stem results in a reduced, but potentially significant, vacuum pressure at the tip. The reduced vacuum pressure will slow the release of the electronic article and for lightweight articles, such as integrated circuit chips, the remaining vacuum pressure may even prevent release.

U.S. Pat. No. 4,767,142 to Takahashi et al. teaches a valving mechanism which reduces the problem caused by leakage around the valve stem. A bypass passageway is provided to link the forward portion of the axial bore to the atmosphere surrounding the tool when vacuum pressure is to be cut off by movement of the valve stem. While the Takahashi et al. device is an improvement over the prior art, the device remains susceptible to leakage about the valve stem. Unless the device is manufactured utilizing close tolerances, leakage still occurs around the valve stem to the rear portion of the axial bore. This leakage may slow the release of an integrated circuit chip. Moreover, the Takahashi et al. device is susceptible to a second leakage along the surface of the valve stem. The second undesired leakage is to the atmosphere during pickup operation of a wafer or integrated circuit chip.

It is an object of the present invention to provide a vacuum-actuated tool for handling electronic articles, wherein the tool insures effective and immediate release of an article with comfortable manipulation by a user.

SUMMARY OF THE INVENTION

The above object has been met by a vacuum-actuated electronic article pickup tool that includes a positive pressure seal of the passageway that leads to a source of vacuum. The tool includes an elongated body having a first passageway to a tip end of the elongated body. The tip end is to be brought into contact with an article to be displaced. The elongated body also includes a second passageway in fluid communication with the vacuum source. It is the second passageway that is blocked by the positive pressure seal upon closing of the valving mechanism. The positive pressure seal prevents fluid communication between the first passageway and the second passageway even where a valving mechanism is manufactured with less than exacting tolerances.

The pickup tool also includes a third passageway selectively linking the first passageway to the ambient atmosphere. Again, a positive pressure seal is utilized, so that undesired leakage does not occur to or from the first passageway. A valve stem is biased into a normally-open or normally-closed position by a spring. The valve stem is a reciprocating member that is slidably fit within the elongated body.

The first and second passageways are axially displaced relative to each other. Preferably, the positive pressure seal includes an elastomeric member, such as an O-ring, that compensates for dimensional differences in manufacturing the tool. Because the passageways are axially displaced, the elastomeric member and the valve stem itself may be used to effectively block air flow. A single elastomeric member may be used to alternate, between sealing of the second and the third passageways relative to the first passageway. However, typically two separate elastomeric members are utilized.

An advantage of the present invention is that the pickup tool may utilize the conventional depressible button valve having a valve stem, but does not require tight dimensional tolerance that increase the expense and that can lead to discomfort to a user during repeated use. Another advantage is that positive pressure sealing of the passageway to the vacuum source simultaneously with a linking of the first and third passageways insures an immediate release of even lightweight articles.

BRIEF DESCRIPTION OF THE DRAWINGS

FIG. 2 is a side, partially sectional view of a second embodiment of the present invention.

FIG. 3-7 are views of the valve seat of FIG. 2.

FIGS. 8 and are views of the valve stem and button of FIG. 2.

FIG. 10 is a side sectional view of a third embodiment of the present invention.

FIG. 11 is aside sectional view of a fourth embodiment of the present invention.

BEST MODE FOR CARRYING OUT THE INVENTION

Figure 1:
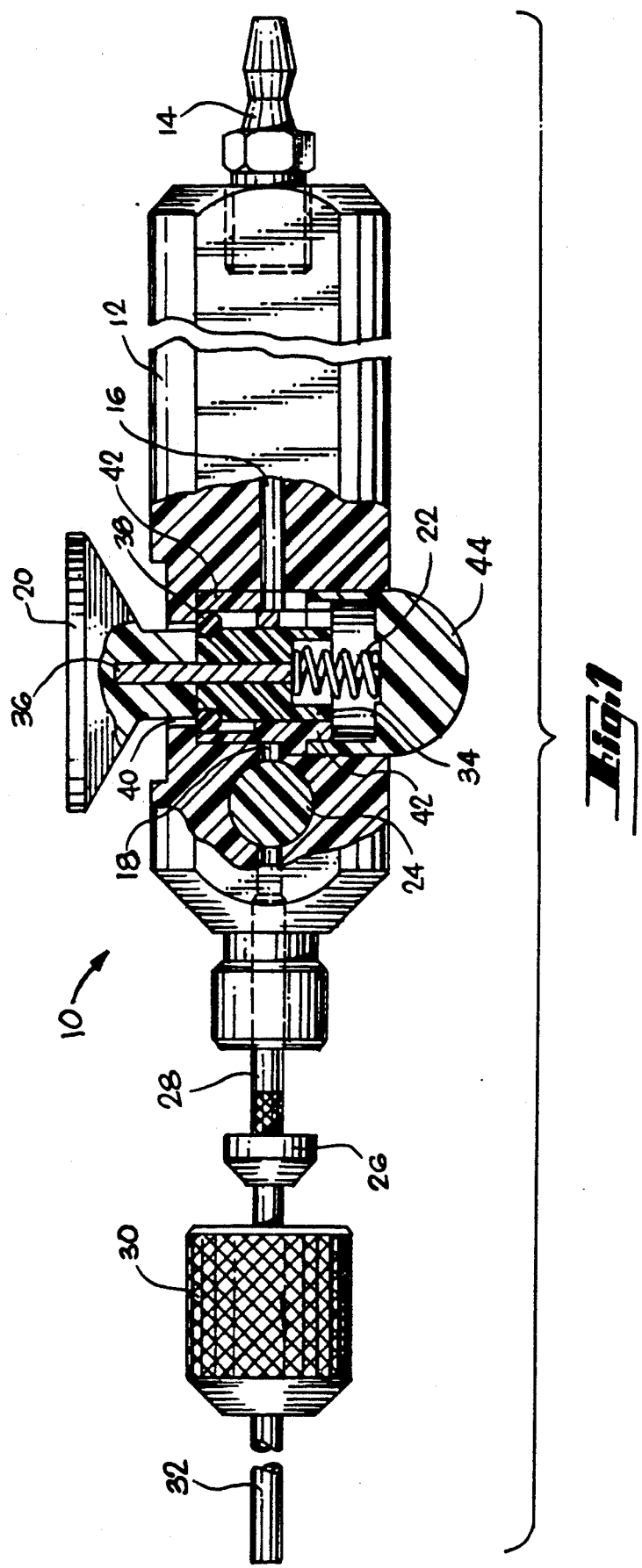
FIG. 1 is a side, partially sectional view of a first embodiment of a vacuum-actuated tool in accord with the present invention.

With reference to FIG. 1, a vacuum-actuated pickup tool 10 is shown as having an elongated body 12. At a back end of the body 12 is a fitting 14 having external threads which are received within an internally threaded bore of the body. The fitting is adapted to be connected to a nose, not shown, leading to a source of vacuum. The fitting includes a passageway in fluid communication with a rearward passageway 16 in the body.

In the position shown in FIG. 1, the rearward passageway 16 is in fluid communication with a forward passageway 18. As will be explained more fully below, the fluid communication between the two passageways 16 and 18 is selectively blocked by depression of a valve button 20. A coil spring 22 biases the valve button into the open position of FIG. 1.

Vacuum pressure may also be blocked by a slide switch 24. When the pickup tool 10 is not to be used for an extended period of time, the slide switch 24 is positioned as shown in FIG. 1. In this position, the forward passageway 18 is interrupted by the slide switch. However, the slide switch is able to move in a direction perpendicular to the forward passageway 18. This movement brings a portion of the slide switch having a diameter less than that of the forward passageway into a position that allows air flow along the length of the forward passageway. Alternatively, the slide switch may have a bore extending therethrough for selective alignment and misalignment with the forward passageway. Because the slide switch is only occasionally used, the switch can be relatively tightly fit within the body 12. In comparison, a tight fit of the structure displaced by depression of the valve button 20 would cause discomfort over time, since the structure is designed for repeated and rapid use.

At the end of the elongated body 12 is fastening hardware designed to allow connection of a number of different tips that can be used in different applications. The hardware includes a lock ferrule 26 on a hollow tube having a first end 28 connected to the body 12 and having a second end 32 adapted for attachment to a pickup tip, not shown. The attachment of the second end to the pickup tip may be a snug-fit arrangement, but preferably includes set screws or a high-temperature cement to prevent rotation of the pickup tip. A lock nut 30 may be threaded onto the body 12 to prevent rotation of the hollow tube at the first end 28.

The structure associated with the valve button 20 is of the type that may be inserted into a conventional vacuum-actuated pickup tool 10. In a conventional pickup tool, the rearward passageway 16 is coaxial with the forward passageway 18. As will be described with the embodiments of FIGS. 10-13, the forward and rearward passageways are preferably axially displaced relative to each other.

The valve button 20 is connected to a valve stem 34 by a dowel pin 36. Both the button 20 and the stem 34 may be press fit to the dowel pin 36, but alternatively a set screw, not shown, may be used to penetrate the valve button 20 to impinge the dowel pin 36. An O-ring 38 is fixed to the valve stem 34. In the position shown in FIG. 1, the O-ring blocks a third passageway 40 formed between the circumference of the button 20 and the body 12. A seating member 42 is positioned between the valve stem 34 and the body 12. A cap 44 is press fit into the body 12 to secure the seating member 42 and the coil spring 22 in position.

A second valving mechanism is shown in FIG. 2 for adapting conventional pickup tools having a rearward passageway 46 that is coaxial with a forward passageway 48. The operation of the second embodiment of FIG. 2 is functionally identical to the operation of FIG. 1, since both embodiments utilize a seating member 50 that separates a valve stem 52 from the elongated body 54 of the pickup tool. Likewise, both embodiments include a single O-ring 56. Again, the O-ring is shown in a position to block a third passageway 58 that extends to the ambient atmosphere.

The valve stem 52 of FIG. 2 is a unitary member having a button 60 and a reduced-diameter portion 62 for mounting of the O-ring 56. The valve stem 52 is biased into the position shown in FIG. 2 by a coil spring 64. Movement of the valve stem is limited at a lower extent by contact of the O-ring 56 with the seating member 50 and is limited at an upper extent by contact of the O-ring with an annular cap 66. The gap between the inside diameter of the cap and the surface of the valve stem defines the third passageway 58. The cap is press fit to the body 54 after assembly of the seating member 50, the coil spring 64, the valve stem 52 and the O-ring 56 within the valve chamber that receives each of these parts. The valve chamber is shown in fluid communication with the forward and rearward passageways 46 and 48, but the O-ring is biased by the coil spring 64 to block the third passageway 58.

As noted above, operation of the embodiments of FIGS. 1 and 2 are essentially identical. Therefore, the description of the operation will be limited to the embodiment of FIG. 2. The seating member 50 is designed to allow evacuation of air from the forward passageway 48 through the rearward passageway 46. Evacuation through the valve chamber includes air flow through a gap 68 between the seating member 50 and the outside surface of the valve stem 52. The seating member is shown in FIGS. 3-7. The seating member is an annular member having upper and lower planar surfaces 70 and 72 formed by cutting away a portion of the outside diameter of the member. The upper planar surface 70 is aligned with the forward passageway 48 through the body 54. An opening 74 permits air flow from the forward passageway 48 to the central region of the seating member 50.

As best seen in FIG. 5, the central region of the seating member 50 includes an upper segment 76 and a lower segment 78. The diameter of the upper segment 76 is greater than the diameter of the lower segment 78. Travel of the O-ring 56 of FIG. 2 is confined to the vertical dimension of the upper segment. Here, the dimension is 0.107", but this is not critical. A shoulder 80 is defined at the bottom of the upper segment. Contact of the O-ring 56 against the shoulder 80 prevents air flow from the upper segment 76 to the lower segment 78.

Air flow that is not restricted by the O-ring 56 travels through the opening 74, the upper and lower segments 76 and 78, and out an opening 82 shown in FIGS. 6 and 7. From the opening 82, air flow enters the rear passageway 46 which is linked to a source of vacuum.

FIGS. 8 and 9 illustrate the valve stem 52 and button 60. To facilitate air flow along the surface of the valve stem, material is moved from the cylindrical stem to form a pair of planar surfaces 84 and 86. The valve stem is reduced in diameter at a central region 62 for seating of the O-ring. The lower extent 88 is also reduced in diameter for proper seating of the coil spring that biases the valve stem.

In operation, the valving mechanism of FIG. 2 is utilized to simultaneously block vacuum pressure exerted through the rearward passageway 46 and link the forward passageway 48 to the ambient atmosphere. In the pickup position of FIG. 2, evacuation is not blocked. Rather, the force exerted by the coil spring 64 presses the O-ring 56 into sealing relation with the cap 66 to positively prevent air flow through the passageway 58. The pressure seal at the O-ring 56 provides a reliable seal without the requirement of exacting tolerances.

Evacuation from the forward passageway 48 is along the upper planar surface 70, through the opening 74, down the gap 68 formed between the valve stem 52 and the seating member 50, through the opening 82, and out the rearward passageway 46.

Pressure on the button 60 in a downward direction overcomes the bias of the coil spring 64. The O-ring 56 is moved from contact with the cap 66 and is brought into contact with the shoulder 80 of the seating member 50. This prevents flow from the opening 74 into the gap 68 adjacent to the valve stem 52. That is, contact of the O-ring against the shoulder 80 blocks flow from the upper segment 76 to the lower segment 78 shown in FIG. 5. Fluid communication between the forward passageway 48 and the rearward passageway 46 is thereby prevented. The positive pressure seal at the gap 68 insures that leakage between the forward and rearward passageways does not occur. Moreover, the valving mechanism provides a quick and reliable return of the forward passageway 48 to atmospheric pressure. Displacement of the O-ring 56 away from the cap 66 links the forward passageway 48 to the ambient atmosphere via the third passageway 58. Because the valve stem 52 is spaced apart from the cap 66 and the seating member 50, rapid and repeated actuation of the valving mechanism does not cause the discomfort associated with valving mechanisms that require exacting tolerances to effectively block undesired leakage from the forward passageway 48 to the rearward passageway 46.

FIGS. 10-13 illustrate other embodiments. In each of these embodiments the forward and rearward passageways are axially displaced relative to each. The axial displacement is preferred, since it more easily allows positive pressure sealing of the passageways without requirement of a serpentine flow path about a sealing member or the like.

With reference to FIG. 10, the body 90 of a vacuum-actuated pickup tool includes a rearward passageway 92 and a forward passageway 94. The body is a two-piece member having an insert 96 that is threaded into a forward piece that includes the valving mechanism. The insert 96 has a large diameter bore 98 that is in fluid communication with the smaller rearward passageway 92.

While the forward passageway 94 is along the axis of the body 90, the rearward passageway 92 is off-axis. The rearward passageway opens to a lower valve chamber 100 that includes a coil spring 102. The coil spring 102 biases a valve stem 104 into a raised position. However, FIG. 10 illustrates the valve stem in a lowered position in which an O-ring 106 blocks flow from the lower valve chamber 100. In the illustrated position, a second O-ring 108 is moved away from a cap 110 to provide a path from the forward passageway 94 to the ambient atmosphere. The path to the ambient atmosphere is through an upper valve chamber 112 and a passageway 114 between the valve stem 104 and the cap 110.

Upon release of pressure on a button 116 that is integral with the valve stem 104, the O-rings 106 and 108 fixed to the valve stem move upwardly. Movement of the lower O-ring 106 permits fluid communication between the rearward and forward passageways 92 and 94 to initiate a pickup of a semiconductor chip or the like. Thus, the positive pressure seal provided by the lower O-ring 106 is removed when the valving mechanism is in a rest position. However, the upper O-ring 104 is pressed against the cap 110 by the coil spring 102. This seals the passageway 114 that leads to the atmosphere. A combination of the two O-rings, therefore, insures against any leakage from the valve chamber 112 into an undesired passageway.

The embodiment of FIG. 11 also includes a two-piece body, an axial forward passageway 120 and an off-axis rearward passageway 122. An important difference between the embodiment of FIG. 11 and that of FIG. 10 is that FIG. 11 includes O-rings 124 and 126 that are stationary. A valve stem 128 includes a plunger 130 which is beveled at upper and lower ends. A coil spring 132 provides a compression force that seats the plunger 130 against the upper o ring 126. In this position, a passageway 134 is sealed from the forward passageway 120. Depression of a button 136 overcomes the bias of the spring 132 to force the plunger 130 into a sealing relation with the lower O-ring 126, thereby blocking vacuum pressure from the rearward passageway 122.

Figure 12:
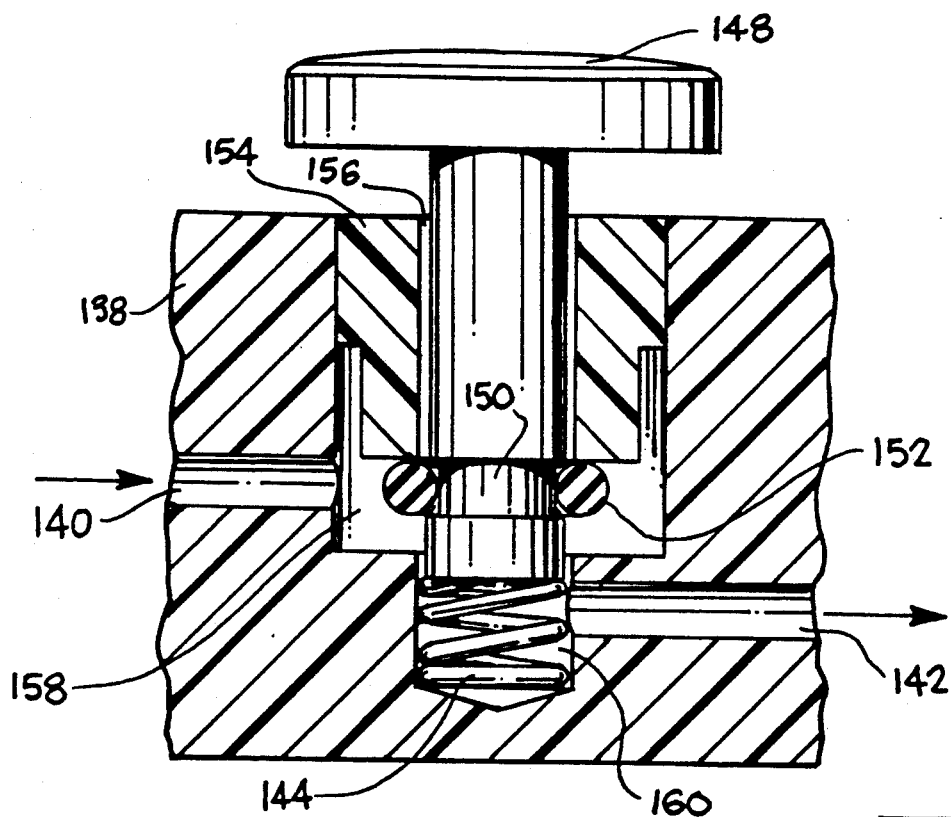
FIG. 12 is a side sectional view of a fifth embodiment of the present invention.
Figure 13:
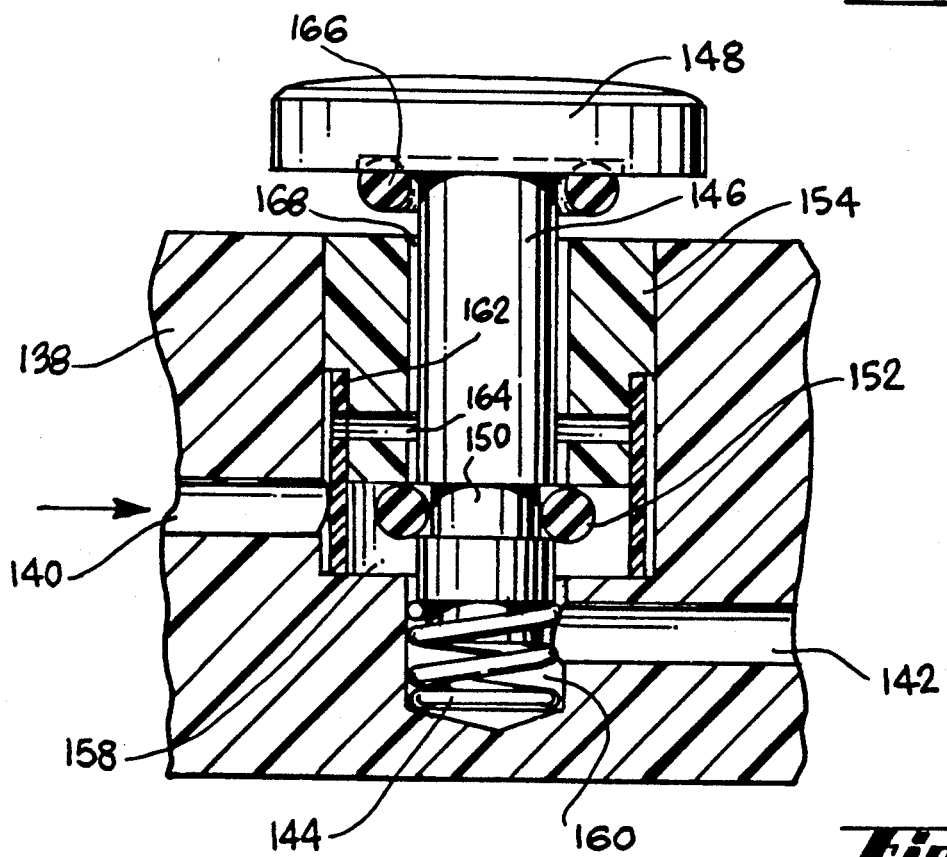
FIG. 13 is a side sectional view of a sixth embodiment of the present invention.

Related embodiments are shown in FIGS. 12 and 13. FIG. 12 shows a valving mechanism in a normally open position, while FIG. 13 is a normally closed valving mechanism. In both embodiments, a valve body 138 includes forward and rearward passageways 140 and 142. The rearward passageway is an off-axis passageway. A coil spring 144 biases a valve stem 146 having a button 148 into an article release position. The valve stem includes a reduced-diameter portion 150 in which an O-ring 152 is mounted.

In the normally open embodiment of FIG. 12, the coil spring 144 presses the O-ring 152 against a cap 154. The elastomeric O-ring 152 acts to seal a passageway 156 between the cap and the valve stem 146. Air evacuation from the forward passageway 140 occurs in this position, as air flows from an upper chamber 158 to the forward passageway, and into a lower chamber 160 connected to the rearward passageway 142. On the other hand, depression of the button 148 lowers the O-ring 152 into sealing relation that blocks flow from the upper chamber 158 to the lower chamber 160. As in each of the embodiments, the forward passageway is simultaneously linked to the ambient atmosphere by a passageway along the surface of the valve stem.

The normally closed embodiment of FIG. 13 differs from the normally open embodiment by inclusion of a sleeve 162, a bore 164 through the cap 154, and a second O-ring 166. In the illustrated rest position of FIG. 13, flow is from the forward passageway 140 and along the outside diameter of the sleeve 162. The sleeve includes an opening that is in alignment with the bore 164. Thus, air is free to flow from the passageway 140 to a gap 168 between the valve stem 146 and the cap 154. However, vacuum pressure from the rearward passageway 142 is blocked by seating of the O-ring 152 against the underside of the cap 154, effectively blocking fluid communication between the rearward passageway and the gap 168.

Depression of the cap 148 brings the second O-ring 166 into contact with the top surface of the cap 154. The forward passageway 140 remains in fluid communication with the gap 168, but the annular structure of the O-ring 166 prevents a flow of air to or from the atmosphere. That is, the O-ring 166 acts to prevent the forward passageway 140 from remaining at atmospheric pressure. The O-ring 166 serves a second function as well. Contact of the O-ring 166 against the upper surface of the cap 154 limits downward movement of the valve stem 146 and the lower O-ring 152 that is housed within the tool. In its lowermost extent, the lower O-ring 152 remains suspended above the surface of the body 138. In this manner, the upper chamber 158 will continue to be in fluid communication with the lower chamber 160, permitting communication of vacuum pressure from the rearward passageway 142, through the two chambers 158 and 160, and into the gap 168 that is in continuous communication with the forward passageway 140.

In each of the six embodiments described above, a positive pressure seal insures that leakage to a vacuum source does not prevent, or even slow, release of a lightweight electronic article, such as an integrated circuit chip. Another common factor is use of a third passageway to release any remnant of vacuum pressure within the forward passageway. While each of the embodiments is illustrated as being actuated by a button, a pivoting lever may be employed.

We claim:

1. A vacuum-actuated article handling tool comprising,
    a body having a chamber and a first flow path extending from said chamber for fluid communication with an article to be displaced, said body having a second flow path from said chamber for connection to a vacuum source, said body having a third flow path extending from said chamber to the atmosphere,
    plunger means mounted to said body for reciprocating movement along an axis of said plunger means so as to regulate air pressure in said first flow path, said plunger means being positioned to allow flow along a radial periphery of said plunger means between said first flow path and said second and third flow paths, said plunger means having a pickup position and a release position, and
    seal means operatively associated with said plunger means for providing a positive pressure seal of said second flow path when said plunger means is in said release position and for providing a seal of said third flow path when said plunger means is in said pickup position, said seal means includes a first elastomeric member coupled to said plunger means for reciprocating movement therewith, said first elastomeric member being cooperative with said plunger means for selectively providing said positive pressure seal of said second flow path while remaining within said chamber and substantially outside of said second and third flow paths with said reciprocating movement of said plunger means said seal means further including a second elastomeric member in positive pressure sealing relation with said third flow path when said plunger means is in said pickup position.

2. The tool of claim 1 further comprising means for biasing said plunger means into one of said pickup and release positions.

3. The tool of claim 1 wherein said plunger means is a finger-actuated member slidably fit into said chamber of said body.

4. A hand-held tool for handling of electronic articles comprising,
    an elongated body having a tip portion and having a back portion adapted to be connected to a vacuum source, said tip portion having a first passageway and said back portion having a second passageway, said body having a third passageway to the atmosphere and having a chamber in fluid communication with each of said first, second and third passageways, and
    valve means disposed within said chamber to alternatively seal said first passageway from said second passageway and said third passageway, said valve means including a slidable stem member mounted for displacement generally perpendicular to the longitudinal axis of said body, said second passageway being associated with a first opening along a periphery of said slidable stem member for fluid communication between said first and second passageways, said third passageway being associated with a second opening along said periphery for fluid communication between said first and third passageways, said valve means having first and second shoulders spaced apart from said periphery by said first and second openings, respectively, said valve means including a seal member positioned to cooperate with said slidable stem member to selectively seat said seal means at said first shoulder, thereby providing a positive pressure seal of said second passageway.

5. The tool of claim 4 wherein said valve means includes a flow path through said chamber from said first passageway to said second passageway, said flow path having a directional component perpendicular to said longitudinal axis of said body.

6. The tool of claim 4 wherein said seal member is an O-ring fixed to said slidable stem member, said tool further comprising a second O-ring mounted to said slidable stem member to selectively provide a positive pressure seal of said third passageway, said second O-ring disposed to selectively seat against said second shoulder.

7. The tool of claim 4 further comprising a means for biasing said slidable stem member into a position to provide said positive pressure seal.

8. A hand-held tool for handling of electronic articles comprising:
    an elongated body having an longitudinal axis and a vacuum passageway, said body having a bore extending generally perpendicular to said longitudinal axis, said vacuum passageway intersecting said bore at a first opening, said body having an inlet passageway intersecting said bore at a second opening, said first opening being spaced apart from said longitudinal axis such that air flow from said inlet passageway to said vacuum passageway requires a first radial flow path relative to said longitudinal axis, a valve having a slidable member, a seat means and a compliant seal, said slidable member spaced apart from said body to define said first radial flow path along an exterior surface of said slidable member and to define a second radial flow path along said exterior surface from said inlet passageway to the atmosphere, said compliant seal fixed to said slidable member and projecting beyond said exterior surface, said seat means disposed such that contact of said compliant seal against said seat means selectively seals said inlet passageway from one of said first and second radial flow paths, said seat means disposed to substantially restrict said compliant seal from entering said first and second radial flow paths, and means for biasing said slidable member into a rest position to seat said compliant seal against said seat means, said biasing means thereby providing a first positive pressure seal of one of said first and second radial flow paths, force overcoming said biasing means providing a second positive pressure seal of one of said first and second radial flow paths.

9. The tool of claim 8 wherein said seat means has first and second seat surfaces, said compliant seal being in flow blocking relation to said first seat surface when said slidable member is in said rest position.

10. The tool of claim 9 wherein said compliant seal is first elastomeric seal and wherein said tool further comprises a second elastomeric seal, each elastomeric seal operatively associated with one of said first and second seat surfaces.

11. The tool of claim 8 wherein said valve includes a button fixed to said slidable member at the exterior of said body.

* * * * *